United States Patent
Byler

(10) Patent No.: US 9,968,015 B2
(45) Date of Patent: *May 8, 2018

(54) CASES HAVING SELECTABLE RF SHIELDING

(71) Applicant: C. A. Byler, Tempe, AZ (US)

(72) Inventor: C. A. Byler, Tempe, AZ (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/655,807

(22) Filed: Jul. 20, 2017

(65) Prior Publication Data

US 2017/0318712 A1    Nov. 2, 2017

Related U.S. Application Data

(63) Continuation-in-part of application No. 14/959,350, filed on Dec. 4, 2015, now Pat. No. 9,755,682.

(60) Provisional application No. 62/103,572, filed on Jan. 15, 2015.

(51) Int. Cl.
  *H05K 9/00* (2006.01)
  *G06F 1/16* (2006.01)
  *H04B 1/3888* (2015.01)

(52) U.S. Cl.
  CPC ......... *H05K 9/0054* (2013.01); *G06F 1/1626* (2013.01); *G06F 1/1656* (2013.01); *H04B 1/3888* (2013.01); *G06F 2200/1633* (2013.01)

(58) Field of Classification Search
  CPC ....... H04B 1/38; G06F 1/1656; G06F 1/1626; G06F 2200/1633
  See application file for complete search history.

(56) References Cited

U.S. PATENT DOCUMENTS

| | | | |
|---|---|---|---|
| 2002/0137475 A1* | 9/2002 | Shou | H04B 1/3838 455/575.8 |
| 2007/0223183 A1* | 9/2007 | Oja | A45C 11/24 361/679.01 |
| 2013/0206844 A1* | 8/2013 | Chen | H04B 1/3888 235/492 |
| 2013/0277101 A1* | 10/2013 | Judy | H05K 9/0043 174/378 |
| 2014/0251368 A1* | 9/2014 | Lawson | A45C 11/00 132/287 |

* cited by examiner

*Primary Examiner* — Dimary Lopez Cruz
*Assistant Examiner* — Abhishek Rathod
(74) *Attorney, Agent, or Firm* — Morgan Law Offices, PLC

(57) ABSTRACT

Device cases with selectable RF shielding are described. Some implementations can include a case for an electronic device. The case can include selectable radio frequency (RF) shielding, such as a Faraday cage. The shielding can be selectable via a mechanically activated switch (e.g., slidable or rotatable), or an electrically activated switch.

11 Claims, 11 Drawing Sheets

CASES HAVING SELECTABLE RF SHIELDING

RELATED APPLICATIONS

This application is a continuation-in-part of Ser. No. 14/959,350, entitled "CASES HAVING SELECTABLE RF SHIELDING," to C. A. Byler, filed Dec. 4, 2015, which claims the benefit of U.S. Provisional Ser. No. 62/103,572, filed on Jan. 15, 2015, the subject matter of both incorporated herein by reference.

BACKGROUND

Radio frequency (RF) technology is used in transferring and communicating data to and from devices. Concerns have been growing over the potential health risks posed by prolonged exposure to RF energy, such as microwave signals, over time. In addition, privacy and security concerns over unauthorized wireless access via RF signals to personal data stored on devices has increased significantly as more personal data is stored on wirelessly accessible devices. Additionally, the number of wireless systems such as keyless entry systems using radio signals to transfer and communicate security information is increasing. A wide variety of wireless devices depend on location and proximity information. This dependency is likely to increase into the future and current proximity and ranging devices are vulnerable to distance modification attacks that can lead to loss of property, such as car theft.

Some cases for portable electronic devices are known in the art to shield the devices from various RF signals including microwaves. These cases may still allow RF signals to reach the device from the sides and or the back. Cases that may completely disable RF signals from reaching the mobile device and radio frequency identification (RFID) cards, may essentially act as a pouch and RF signals cannot be transmitted or received without removing the device from the pouch. Presently there appears to be no device case having a mechanical or electrical solution for selectably enabling and disabling RF signal access for the device while contained within the case.

Implementations of the disclosed subject matter were conceived in light of the above-mentioned problems and limitations, among other things.

SUMMARY

Some implementations can include a case having Faraday cage-type RF shielding with a user selectable mechanism to turn on or off the shielding offered by the Faraday cage-type shielding. Some implementations provide an easy way for the user to utilize an RF shielding device where the shielding can be enabled and disabled by sliding or rotating a member that allows RF signals to be blocked from reaching the device or to be permitted to reach the device when the user wishes to have the RF shielded device capable of transmitting and/or receiving RF signals. A need may exist for users of electronic devices placed within RF shielding enclosures to be able to easily enable and disable the RF shielding properties of the shielding enclosure.

Some implementations may provide a method of enabling/disabling RF radiation to and from a case by utilizing a movable part that acts as a Faraday-cage switch. The case can contain electrically conductive material that provides a shield to prevent electromagnetic energy from entering or leaving the case in addition to non-conductive openings for radio frequencies to pass through. The case can include a moveable member (e.g., a slider or iris-type member) that can be made of a conductive material. In the example of a sliding moveable member, the slider can be formed with a generally rectangular body portion, from one side projects an elongated slider actuating arm piece. The slider can include one or more openings of a non-conductive material that allow RF to penetrate the case when open (e.g., aligned with opening in the body of the case) and block RF when closed (e.g., aligned with conductive portion of the body of the case).

In some implementations, a rotating moveable member, much like an iris of a camera, may be utilized for this purpose. The openings may contain an antenna to help increase or amplify an RF signal when the moveable member is in the open position. Additionally, an electrically switched shielding element may be used that includes electrically activated substrates that can be activated to either allow or block RF radiation much like LCD materials on windows that can make the windows either transparent or opaque.

Some implementations can include a case having a first portion and a second portion. At least one of the first portion and the second portion can include a fixed portion and a moveable portion. The moveable portion can be configured to be moved, relative to the fixed portion, between a first position and a second position. When in the first position, the moveable portion covers an opening in the fixed portion so as to substantially block radio frequency energy from passing through the opening. And when in the second position, the moveable portion can expose the opening to permit radio frequency energy to pass through the opening.

The first portion and the second portion include Faraday shielding material except for the opening, which does not include Faraday shielding material. The case can be configured to receive a portable electronic device within an interior space defined by the first portion and the second portion.

An interior of at least one of the first portion and the second portion includes at least one slot configured to hold at least one card readable by radio frequency energy. An antenna can be disposed near the opening and configured to pass a radio frequency signal from an exterior of the case to an electronic device within the case.

The Faraday shielding material can include one or more of a conductive mesh, a conductive paint, metal, carbon fiber, and conductive radio frequency (RF) shielding injection moldable plastic. The moveable portion can be configured to move in a substantially linear motion relative to the fixed portion. The moveable portion can be configured to move in a substantially rotational motion relative to the fixed portion.

The case can include one or more additional openings. One of the first portion and the second portion can include a substantially transparent section having Faraday shielding material.

BRIEF DESCRIPTION OF THE DRAWINGS

FIGS. 6A and 6B are diagrams of another example case configured to hold key fob or the like.

FIG. 9 is a diagram of yet another example case configured to hold key fob or the like.

DETAILED DESCRIPTION

A method of joining two or more conductive materials to form an enclosure or case for an electronic device can include providing one or more conductive and non-conductive materials and arranging the materials in such a way that provides characteristics similar to that of a Faraday cage as well as an easy means for a user to position elements of the enclosure in such a way as to allow RF radiation to pass through the enclosure when these materials are positioned in another configuration.

Figure 1A:
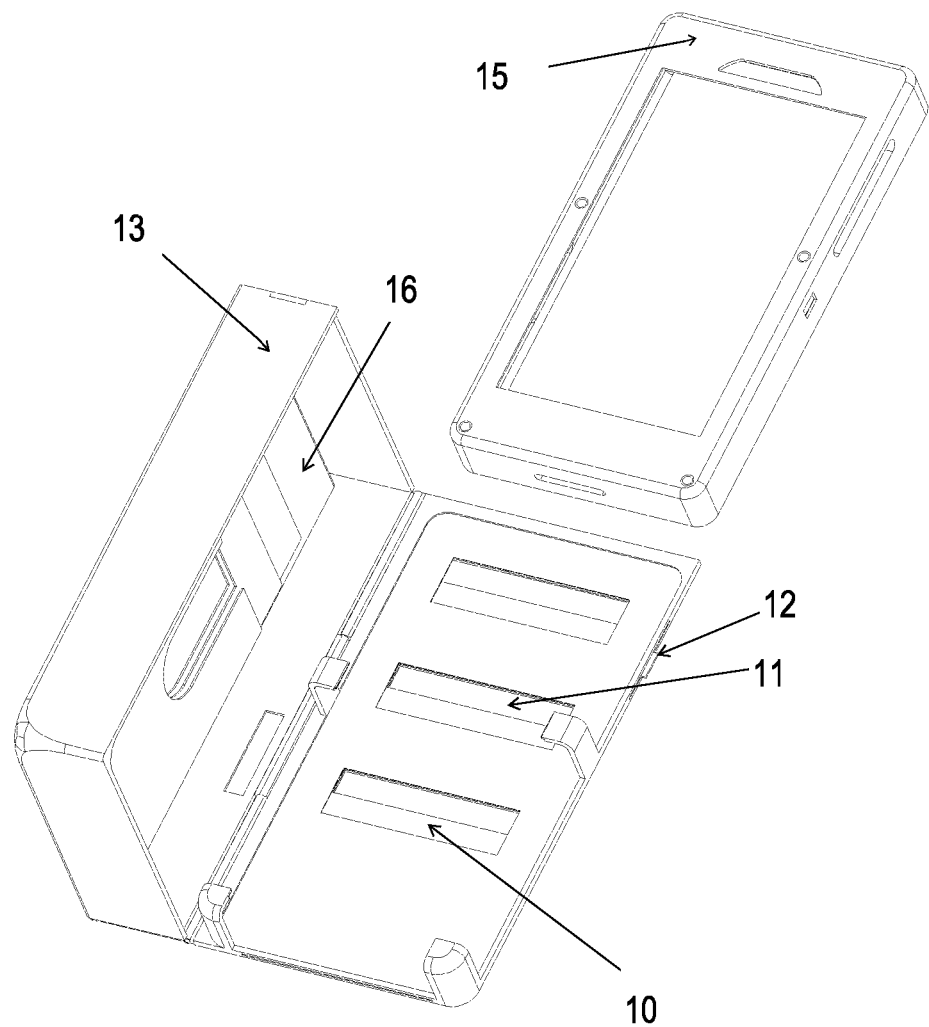
FIG. 1A is a diagram of an example case containing a mobile phone holder in addition to card slots for RFID cards and other wallet type items in accordance with some implementations.

FIG. 1A is a diagram of an example case containing a mobile phone holder in addition to card slots for RFID cards and other wallet type items. The case includes conductive Faraday cage material 13, such as a conductive mesh, paint, metal, carbon fiber, conductive RF shielding injection moldable plastic or other suitable type of Faraday or conductive material. The back of the case contains openings 11 that permit RF signals to pass through. The openings 11 can be formed from nonconductive materials that will allow RF signals to pass through. Openings for input/output needs such as power connector and camera lens contain a sliding conductive material that enables RF shielding when closed. A slidable wafer 10 enclosed within the case contains conductive Faraday cage material and has openings that align with the non conductive openings on the case when the wafer slider is in the open position allowing RF to pass and conductive material that closes the openings and enables the Faraday cage in the closed position. An elongated actuating arm piece 12 projects from the rectangular wafer to enable both open and closed positions through a sliding motion. A typical cell phone case 15 fits into the wallet case containing card slots 16 for holding RFID cards and other wallet type items.

Figure 1B:
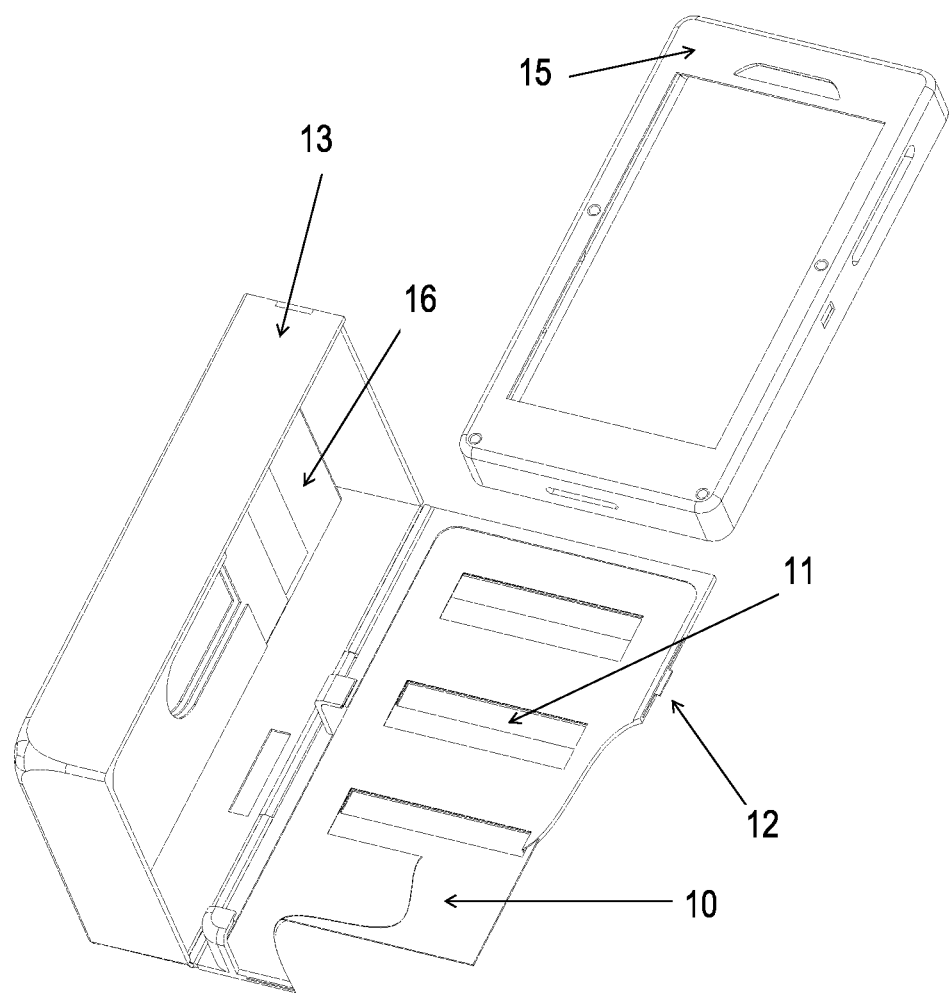
FIG. 1B is a diagram of a cross section of an example case having a slideable RF shield in accordance with some implementations.

FIG. 1B is a diagram of a cross section of the case shown in FIG. 1A showing a slidable wafer RF shield that is multi-positional and contains electrically conductive material 10 with a generally rectangular body portion and an elongated slider actuating arm piece 12 projecting from one side. The slidable wafer contains openings of a non-conductive material that allow RF to penetrate the case when open 11. The wafer openings may contain an antenna to increase the RF signal when aligned with the case openings. When the wafer is slid into the closed position, RF is shielded and the Faraday cage is enabled.

Figure 2A:
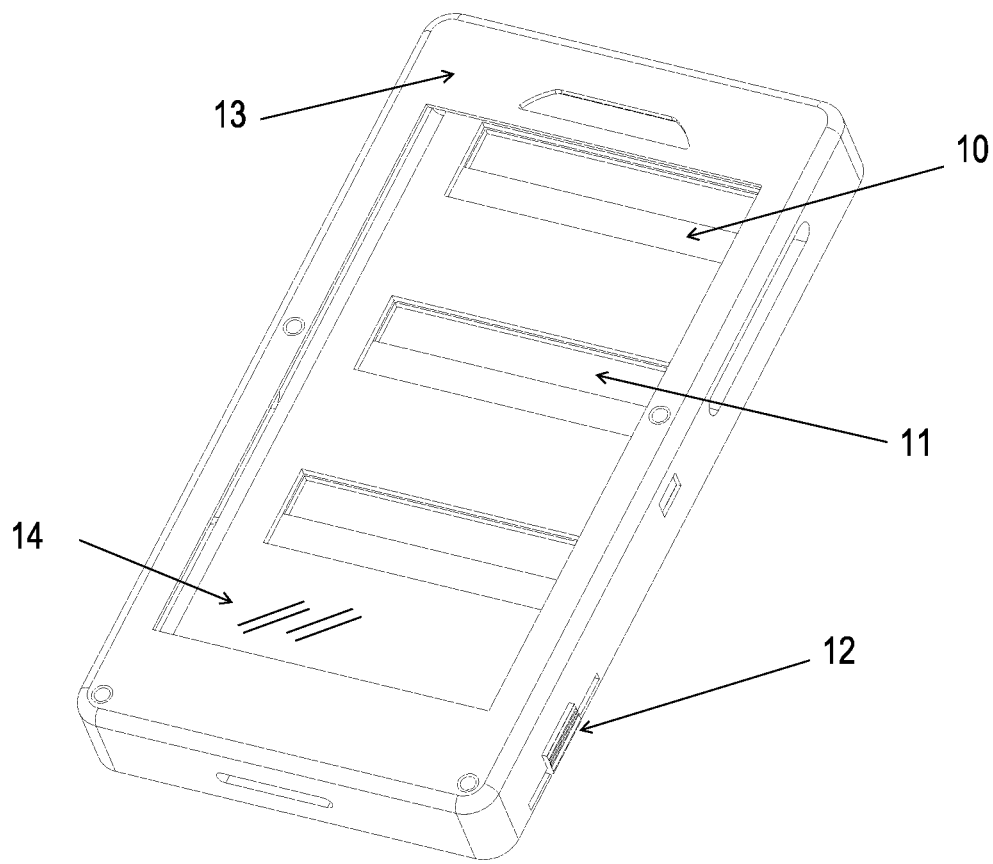
FIG. 2A is a diagram of an example case containing a mobile phone in accordance with some implementations.

FIG. 2A is a diagram of an example case containing a mobile phone, the case includes conductive Faraday cage material 13, the conductive material lining the case contains a conductive mesh, paint, metal, carbon fiber, conductive RF shielding injection moldable plastic or other suitable type of Faraday or conductive material. The display part of the case contains a transparent conductive material in the front to allow interaction with the device while within the case 14, this transparent material may consist of silver nanoparticles or other transparent conductive material to allow for use. The back of the case contains openings or non Faraday cage material that will allow RF waves to pass 11. A slidable wafer 10 enclosed within the case contains conductive Faraday cage material and has openings that align with the openings on the case when the wafer slider is in the open position allowing RF to pass and conductive material that closes the openings and enables the Faraday cage in the closed position. An elongated actuating arm piece 12 projects from the rectangular wafer to enable both open and closed positions through a sliding motion.

Figure 2B:
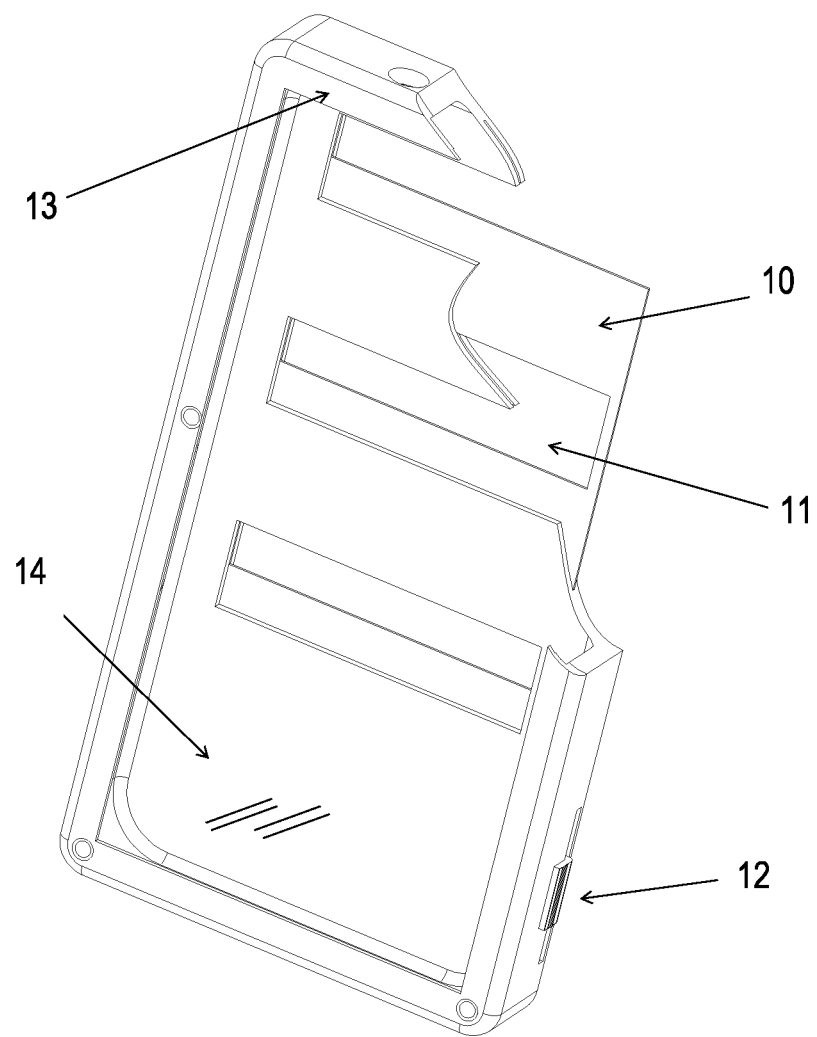
FIG. 2B is a diagram of a cross section of an example mobile phone case having a slideable RF shield in accordance with some implementations.

FIG. 2B is a diagram showing a cross section of the case shown in FIG. 2A with a slidable wafer RF shield that is multi-positional and contains electrically conductive material 10 with a generally rectangular body portion, from one side projects an elongated slider actuating arm piece 12. The slidable wafer contains openings of a non-conductive material that allow RF to penetrate the case when open 11. The wafer openings may contain an antenna to increase the RF signal when aligned with the case openings. When the wafer is slid into the closed position, RF is shielded and the Faraday cage is enabled.

Figure 3:
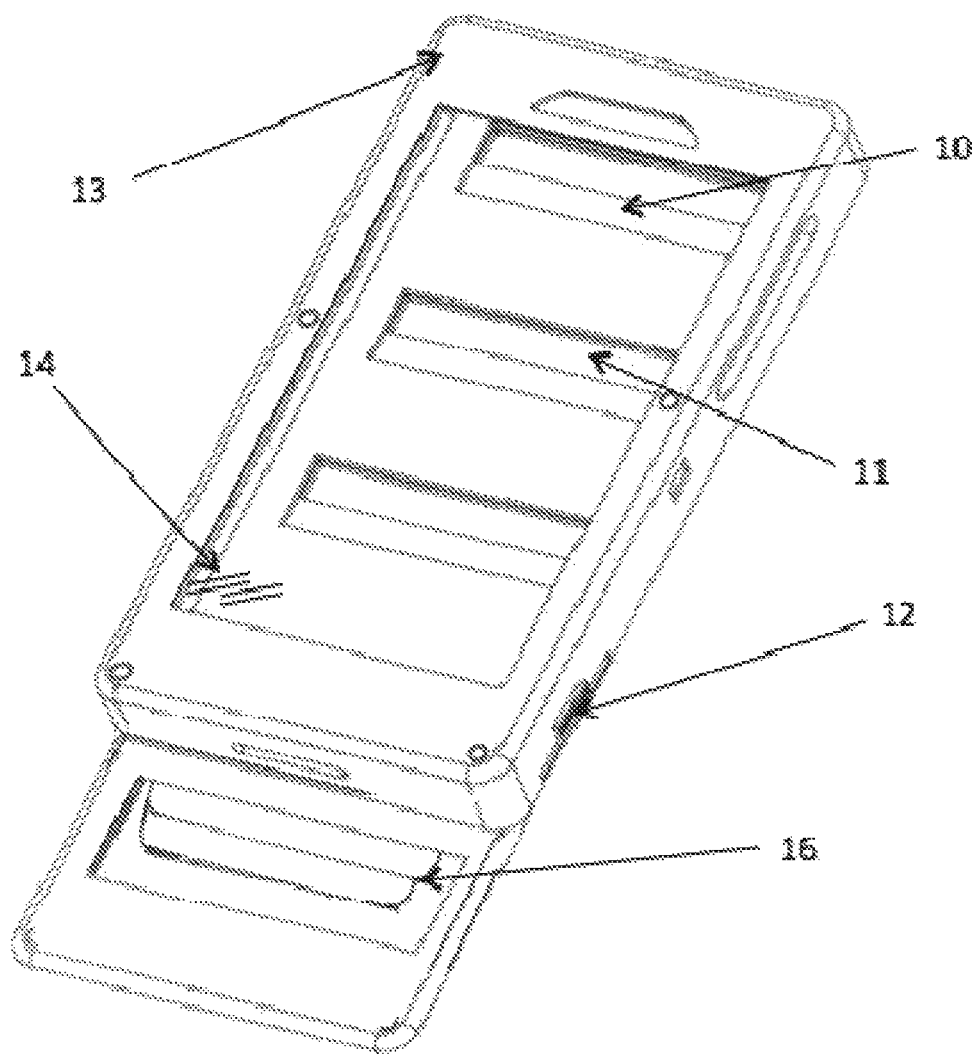
FIG. 3 is a diagram of an example case containing a mobile phone and card slots for RFID and other wallet type items in back portion of the case in accordance with some implementations.

FIG. 3 is a diagram of an example case containing a mobile phone, the case containing conductive Faraday cage material 13, the conductive material lining the case contains a conductive mesh, paint, metal, carbon fiber, conductive RF shielding injection moldable plastic or nearly any other type of Faraday or conductive material. The display part of the case contains a transparent conductive material in the front to allow interaction with the device while within the case 14, this transparent material may consist of silver nanoparticles or other transparent conductive material to allow for use. The back of the case contains openings or non Faraday cage material that will allow RF waves to pass 11. A slidable wafer enclosed within the case contains conductive Faraday cage material and has openings that align with the openings on the case when the wafer slider is in the open position allowing RF to pass and conductive material that closes the openings and enables the Faraday cage in the closed position 10. An elongated actuating arm piece 12 projects from the rectangular wafer to enable both open and closed positions through a sliding motion. A container 16 for holding RFID cards and other wallet type items is positioned in back part of the case between the phone and sliding wafer and accessed through sliding a compartment vertically or horizontally.

Figure 4:
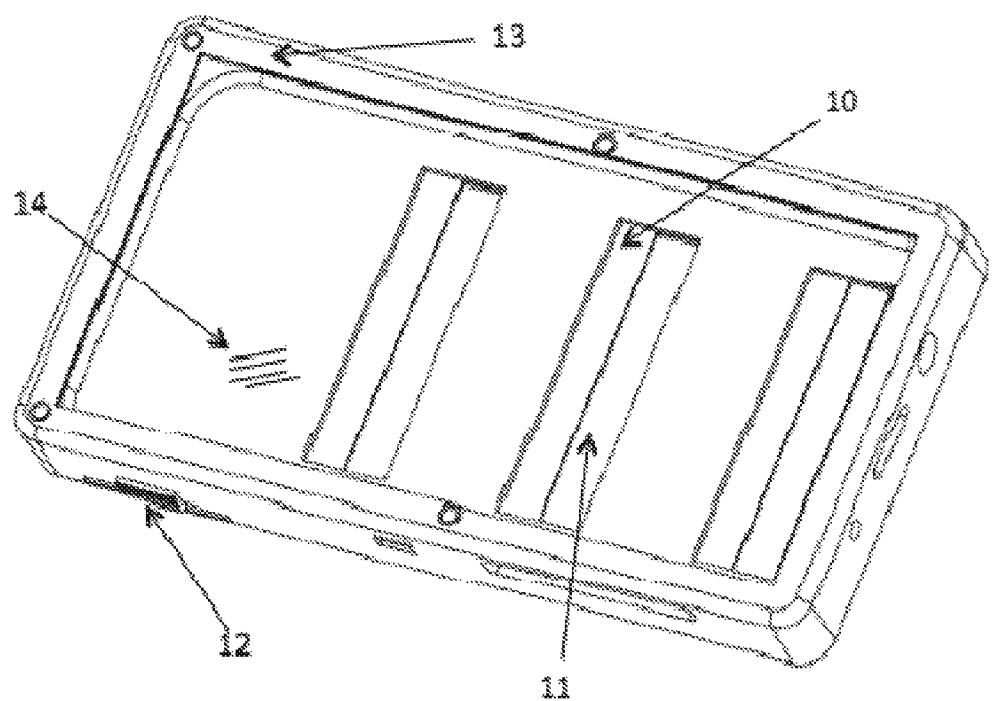
FIG. 4 is a diagram of an example case configured for use with a tablet or similar electronic device in accordance with some implementations.

FIG. 4 illustrates the present invention on a case containing a tablet, the case containing conductive Faraday cage material 13, the conductive material lining the case contains a conductive mesh, paint, metal, carbon fiber, conductive RF shielding injection moldable plastic or nearly any other type of Faraday or conductive material. The display part of the case contains a transparent conductive material in the front to allow interaction with the device while within the case 14, this transparent material may consist of silver nanoparticles or other transparent conductive material to allow for use. The back of the case contains openings or non Faraday cage material that will allow RF waves to pass 11. A slidable wafer enclosed within the case contains conductive Faraday cage material and has openings that synch with the openings on the case when the wafer slider is in the open position allowing RF to pass and conductive material that closes the openings and enables the Faraday cage in the closed position 10. An elongated actuating arm piece 12 projects from the rectangular wafer to enable both open and closed positions through a sliding motion.

Figure 5A:
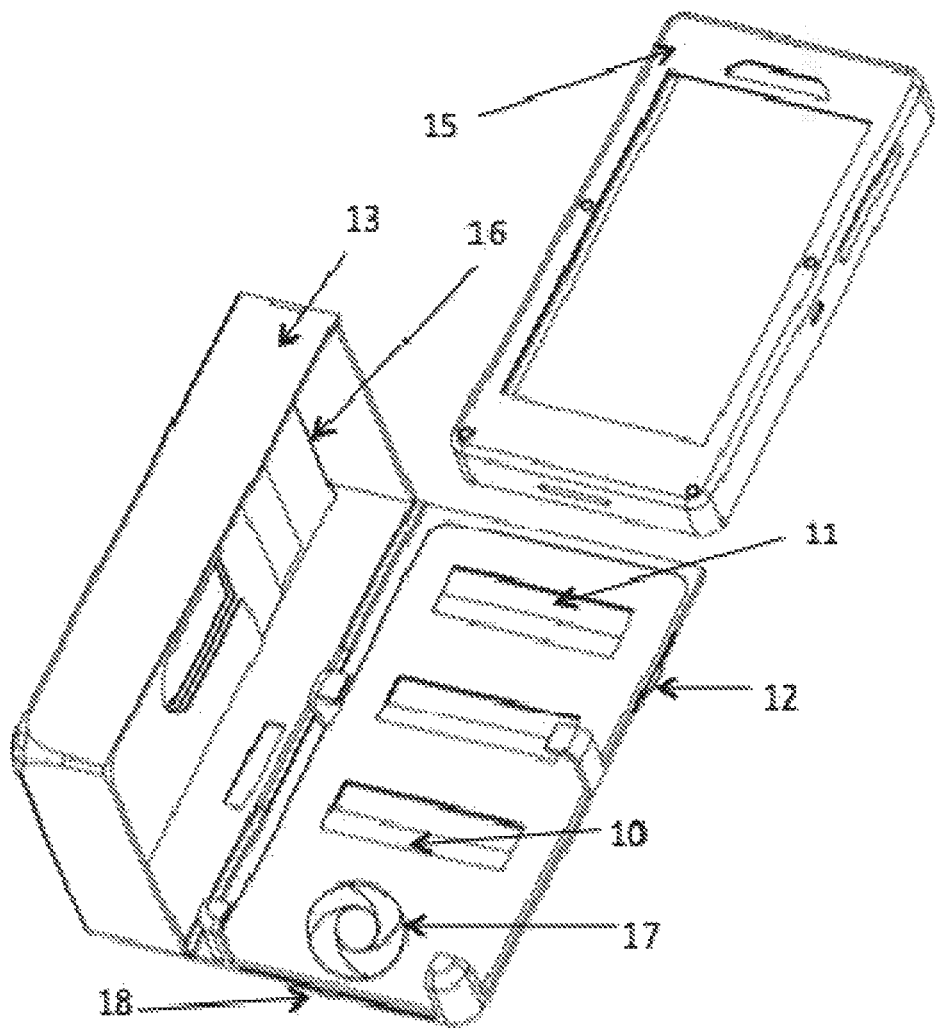
FIGS. 5A and 5B are diagrams of an example case configured to hold a mobile phone holder in addition to card slots for RFID cards and other wallet type items with multiple switches, one including a rotating means of allowing RF energy to penetrate and escape the case in accordance with some implementations.
Figure 5B:
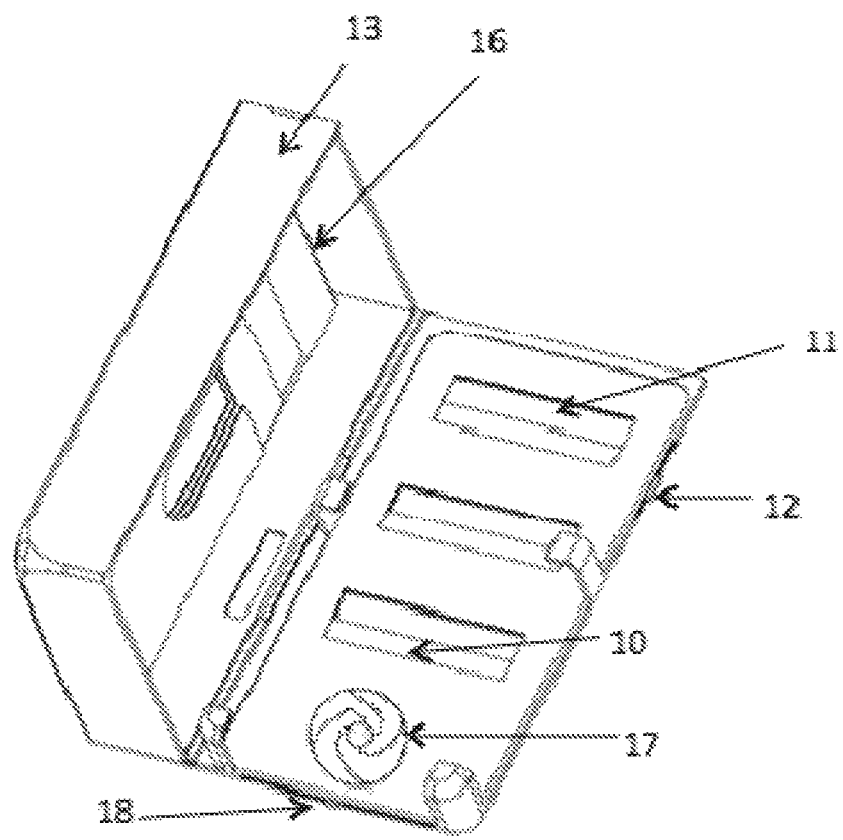

In FIGS. 5A and 5B, the wafer slides vertically and a rotating mechanism permits RF signals to penetrate and escape the case with a horizontal sliding actuating arm. The rotating component 17 has at least one matched pair of vanes containing Faraday cage material which are actuated by a rotating plate to modify size of the orifice and regulate flow of RF. An elongated actuating arm piece 18 projects from the rotating component to enable both open and closed positions through a horizontal sliding motion.

In another embodiment, the wafer or rotating component could slide vertically, horizontally or a combination of horizontal and vertical slides with one to many windows depending on the configuration of the RF chips on the device and whether one or multiple chips have RF signaling enabled/disabled.

Figure 6A:
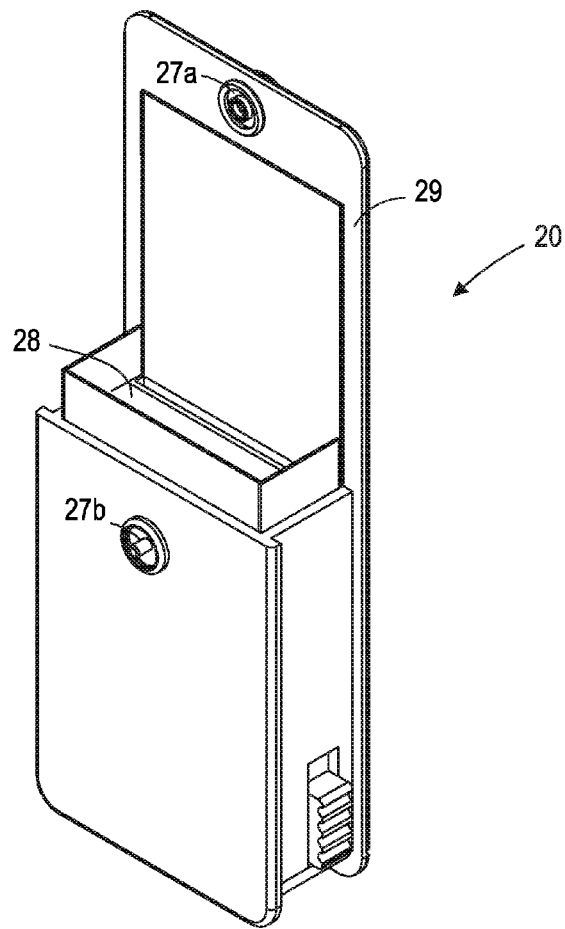
Figure 6B:
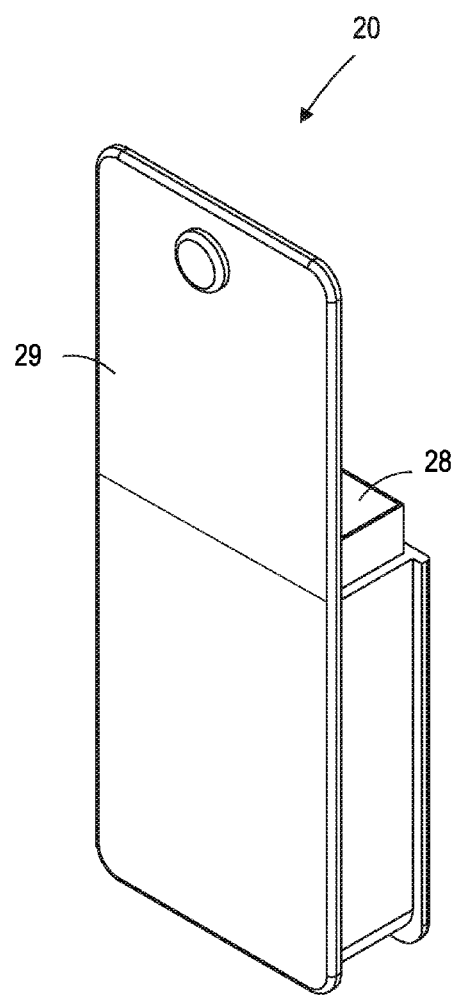

FIGS. 6A and 6B illustrate front and rear perspective views, respectively, of a case 20 capable of containing in an interior compartment 28 thereof a key fob or the like. For example, the case 20 can be used to hold an automotive key fob for a passive keyless entry (PKE) system, an automotive key fob for a remote keyless entry (RKE) system, an electronic toll collection transponder, or a fob used for building entry, etc. In an embodiment, the interior compartment 28 is about 1 to 3 inches in width and about 2 to 5 inches in height though these dimensions can vary depending on the sizes of available key fobs or the like. Although the case 20 is shown in an open position, it is to be understood that the case 20 can be closed by simply bending a flap 29 such that the female snap 27a aligns with the male snap 27b. Further, it is to be appreciated that various other fastener devices for the case may suffice, and also that the case may be configured differently from the illustrated case 20, such as, for example, including a hinged cover or a clamshell design.

Figure 7:
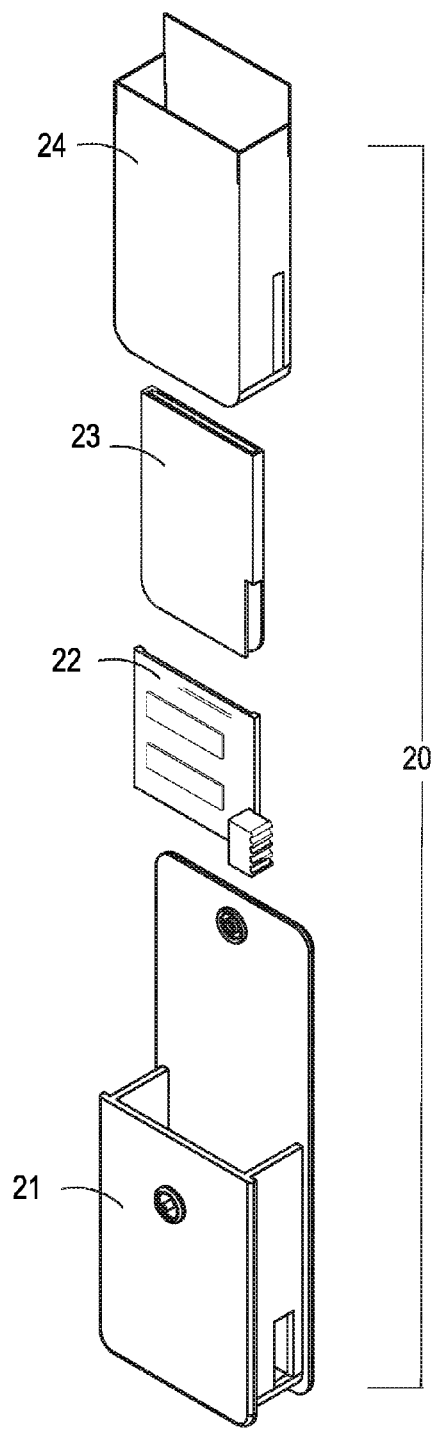
FIG. 7 shows an exploded view of the case of FIGS. 6A and 6B.
Figure 8:
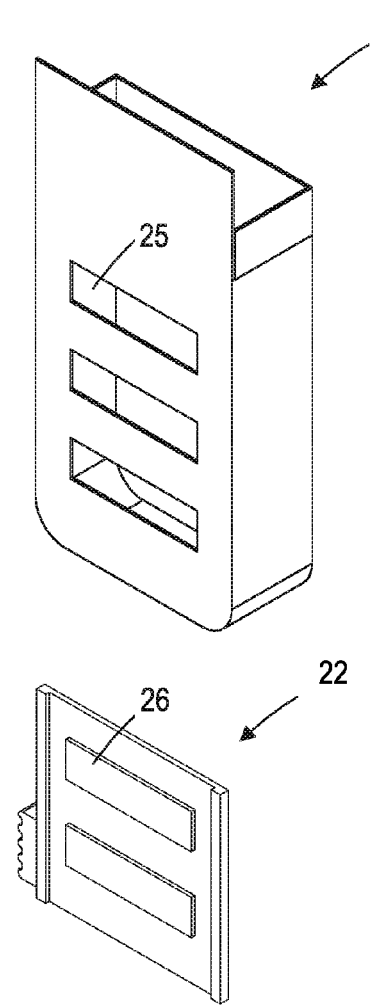
FIG. 8 shows a perspective view of a conductive mesh and slidable wafer components of the case of FIGS. 6A and 6B.

FIG. 7 is an exploded view of the exemplary case 20 showing the components of the case 20, according to an embodiment. The components include a housing 21, a sliding member 22, a sleeve 23, and a shielding enclosure 24. The housing 21 is preferably made of a durable non-conductive material such as genuine or synthetic leather, fabric, molded plastic, etc. The shielding enclosure 24 is inserted into the housing 21. The shielding enclosure 24 includes material that electromagnetically shields an object (such as a key fob) contained therein when the case 20 is closed but includes one or more window 25 (FIG. 8) that can be opened by a user to permit RF signals to pass through to the interior 28 without significant interference and to allow operation of a device such as a key fob contained therein with respect to another device communicatively coupled thereto such as a keyless entry system. To accomplish this, the shielding enclosure 24 is made of a Faraday or conductive material or includes a lining such as conductive paint, metal, carbon fiber, conductive RF shielding injection moldable plastic or other suitable type of Faraday or conductive material. However, the windows 25 are substantially non-shielded portions of the shielding enclosure 24 (or even actual holes in the shielding enclosure 24). For example, the shielding enclosure 24 can be lined with a Faraday or conductive material except for where the one or more windows 25 are situated. The sleeve 23 is fitted into the shielding enclosure 24, and the sliding member 22 is inserted into the sleeve 23. The sleeve 23 is made of substantially non-conductive material while the sliding member 22 is constructed of Faraday or a conductive material. As with the shielding enclosure 24, the sliding member 22 includes openings 26 that are similar to the windows 25 in that they allow RF signals to pass through without substantial interference. The sliding member 22 slides vertically relative to the shielding enclosure 24 to permit RF signals to penetrate and escape the case 20 when the openings 26 align with corresponding windows 25. Accordingly, when selectively opened, RF signals can pass through to the interior 28 without significant interference and to allow operation of a device such as a key fob contained therein with respect to another device communicatively coupled thereto such as a keyless entry system. Conversely, when the windows 25 are selectively closed, the RF signals are blocked so as to interfere with any communication. In the illustrated embodiment, the sliding member 22 includes two openings 26 while the shielding enclosure 24 includes three windows 25. In the closed position, all of the windows 25 are blocked by portions of the sliding member 22 that contain shielding material; whereas in the open position, the windows 25 are not blocked but instead the openings 26 align with the two of the windows 25. In other embodiments, the sliding member 22 and the shielding enclosure 24 have the same number of openings as windows.

Figure 9:
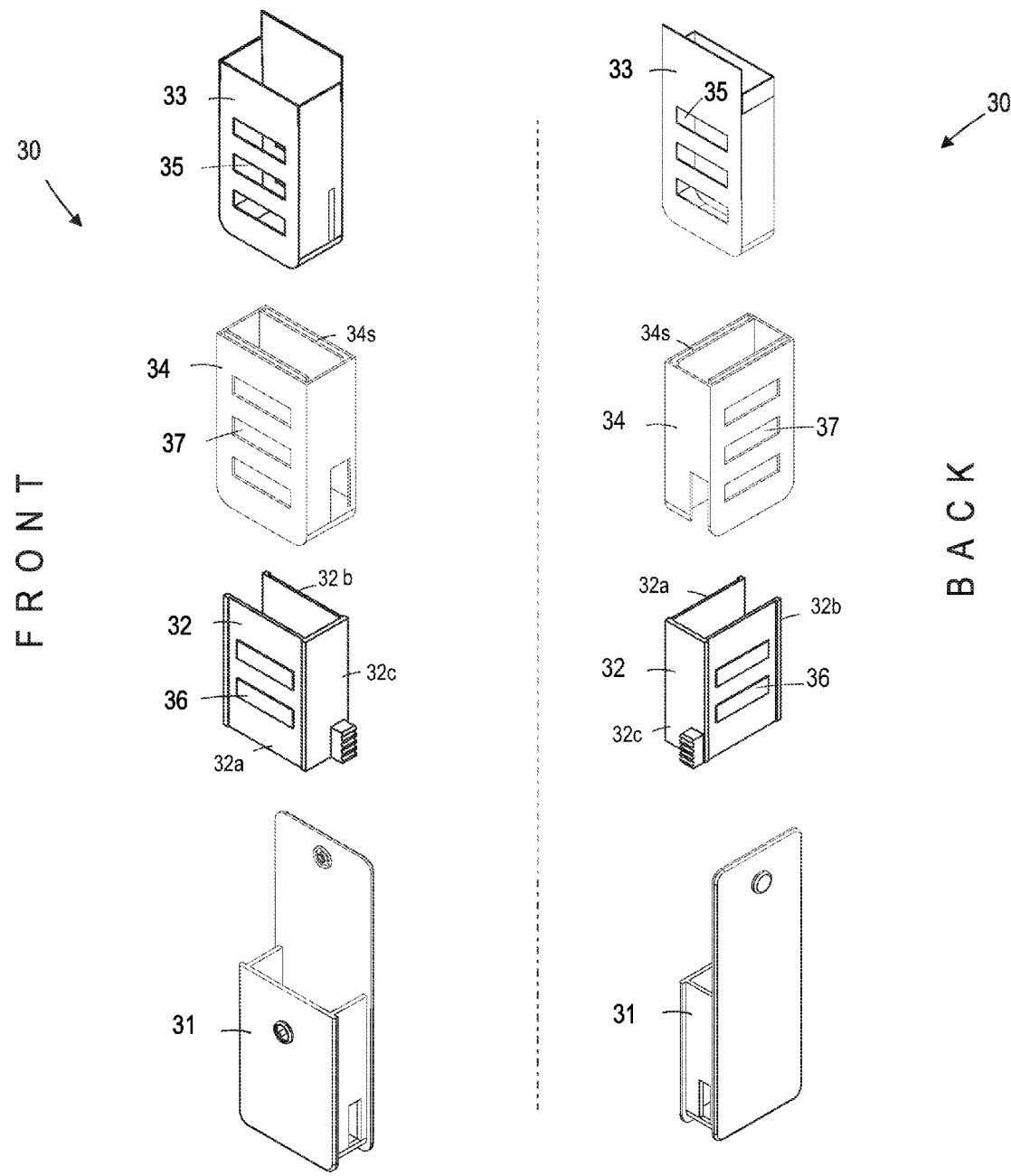

FIG. 9 illustrates front and back views of a case 30 configured to hold a key fob or the like, according to another embodiment. As shown, the case 30 includes a housing 31, a slidable member 32, a shielding enclosure 33, and a sleeve 34. The case 30 is similar to the case 20, the main difference being that windows are arranged on both the front and back of the shielding enclosure 33. When assembled, the shielding enclosure 33, sleeve 34, and slidable member 36 are inserted into the case 30. As shown, in this embodiment, the slidable member 32 includes sides 32a and 32b that are substantially parallel joined to side 32c, forming a U-shaped structure. The sides 32a, 32b, and 32c of the slidable member are inserted into slot 34s of the sleeve 34. As before, the shielding enclosure 33 and the slidable member 32 include shielding material except that the windows 35 and openings 36, respectively, do not have shielding so as to allow RF signals to pass through them without significant interference. The windows 35 are opened when the openings 36 of the slidable member 32 align with two of the windows 35. In the illustrated embodiment, the sleeve 33 also has openings 37 which will align with the windows 35 of the shielding member 33. In this embodiment, the RF signals will be able to pass through the case 30 when the openings 36 align with the windows 35 of the shielding enclosure 33 and the openings 37 in the sleeve. Accordingly, when selectively opened, RF signals can pass through to the interior of the case 30 without significant interference and to allow operation of a device such as a key fob contained therein with respect to another device communicatively coupled thereto such as a keyless entry system. Conversely, when selectively closed, the RF signals are blocked so as to interfere with any communication. In this embodiment, the sleeve can include conductive material or Faraday material except at the openings 37. In other embodiments, the sleeve 33 does not have windows and is constructed of a material that allows RF signals to pass through.

In addition to the implementations described above detailing cases for mobile phones, tablets, automotive keys and fobs, and containers holding RFID cards, another implementation includes a case containing a Faraday cage switch for any RF transmitting or receiving device such as, but not limited to, tablets (FIG. 4), laptops, cellular phones (e.g., smart phones, flip phones, etc.), Wi-Fi routers, gaming consoles, smart meters, smart home devices, vehicular communication devices, smart watches, fitness bands, wearable computers (e.g., Google Glass, etc.) and wireless dongles/adapters. As used herein, "device" or "electronic device" can include any device or apparatus that can receive, transmit, react to or respond to a radio frequency signal.

It is, therefore, apparent that there is provided, in accordance with the various embodiments disclosed herein, device cases having selectable RF shielding.

While the disclosed subject matter has been described in conjunction with a number of embodiments, it is evident that many alternatives, modifications and variations would be, or are, apparent to those of ordinary skill in the applicable arts. Accordingly, Applicant intends to embrace all such alternatives, modifications, equivalents and variations that are within the spirit and scope of the disclosed subject matter.

What is claimed is:

1. A case comprising,
   a housing,
   a shielding enclosure disposed within the housing; and
   a slidable member;
   wherein the slidable member is configured to be moved, relative to the shielding enclosure, between a first position and a second position, when in the first position, the slidable member covering one or more windows in the shielding enclosure so as to substantially block radio frequency energy from passing through the one or more windows, and when in the second position the slidable member aligning one or more openings in the slidable member with the corresponding one or more windows in the shielding enclosure to permit radio frequency energy to pass through the one or more aligned openings; and
   wherein the slidable member and the shielding enclosure include RF shielding material except for the opening, which does not include RF shielding material.

2. The case of claim 1, further including a sleeve that facilitates sliding of the slidable member.

3. The case of claim 2, wherein the sleeve includes opening that are aligned with the corresponding windows in the shielding enclosure.

4. The case of claim 1, wherein the windows of the shielding enclosure and the openings of the slidable member are disposed on both a back and a front side.

5. The case of claim 1, wherein the slidable member is U-shaped.

6. The case of claim 5, further including a sleeve inserted in the case having a slot to accommodate sliding of the slidable member.

7. The case of claim 1, wherein the case is configured to enclose a fob within an interior space defined by the first portion and the second portion.

8. The case of claim 7, wherein the fob is an automotive key fob.

9. The case of claim 8, wherein the automotive key fob is a passive keyless entry fob.

10. The case of claim 8, wherein the automotive key fob is a remote keyless entry fob.

11. A case comprising:
    a first portion; and
    a second portion,
    wherein at least one of the first portion and the second portion includes a fixed portion and a moveable portion, the moveable portion configured to be moved, relative to the fixed portion, between a first position and a second position, when in the first position, the moveable portion covering one or more openings in the fixed portion so as to substantially block radio frequency energy from passing through the one or more openings, and when in the second position the moveable portion aligning one or more openings in the moveable portion with the corresponding one or more openings in the fixed portion to permit radio frequency energy to pass through the one or more aligned openings, and
    wherein the first portion and the second portion include RF shielding material except for the opening, which does not include RF shielding material.

* * * * *